(12) United States Patent
Vogelsang et al.

(10) Patent No.: US 11,972,121 B2
(45) Date of Patent: Apr. 30, 2024

(54) LOAD-REDUCED DRAM STACK

(71) Applicant: Rambus Inc., San Jose, CA (US)

(72) Inventors: Thomas Vogelsang, Mountain View, CA (US); Liji Gopalakrishnan, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 69 days.

(21) Appl. No.: 17/800,601

(22) PCT Filed: Feb. 25, 2021

(86) PCT No.: PCT/US2021/019642
§ 371 (c)(1),
(2) Date: Aug. 18, 2022

(87) PCT Pub. No.: WO2021/178208
PCT Pub. Date: Sep. 10, 2021

(65) Prior Publication Data
US 2023/0072674 A1    Mar. 9, 2023

Related U.S. Application Data

(60) Provisional application No. 62/984,070, filed on Mar. 2, 2020.

(51) Int. Cl.
*G06F 3/06* (2006.01)
(52) U.S. Cl.
CPC .......... *G06F 3/0625* (2013.01); *G06F 3/0629* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 6,618,791 B1 | 9/2003 | Dodd et al. | |
| 7,200,021 B2 | 4/2007 | Raghuram | |
| 7,266,639 B2 | 9/2007 | Raghuram | |
| 8,531,882 B2* | 9/2013 | Fujimura | G11C 16/06 365/185.11 |
| 10,262,699 B2* | 4/2019 | Oh | G11C 5/02 |
| 10,290,328 B2 | 5/2019 | Lee | |
| 10,381,067 B2 | 8/2019 | Shaeffer et al. | |
| 11,688,443 B2* | 6/2023 | Lee | G11C 29/023 327/276 |
| 2005/0082664 A1* | 4/2005 | Funaba | H01L 23/544 257/E23.179 |
| 2006/0262587 A1 | 11/2006 | Matsui et al. | |
| 2008/0126690 A1 | 5/2008 | Rajan et al. | |
| 2010/0020583 A1* | 1/2010 | Kang | G11C 29/14 365/51 |

(Continued)

OTHER PUBLICATIONS

Notification of Transmittal of the International Search Report and the Written Opinion of the International Searching Authority, or the Declaration dated May 6, 2021 re: Int'l Appln. No. PCT/US21/019642. 10 pages.

*Primary Examiner* — Elias Mamo
(74) *Attorney, Agent, or Firm* — Charles Shemwell

(57) ABSTRACT

Power consumption in a three-dimensional stack of integrated-circuit memory dies is reduced through selective enabling/disabling of physical signaling interfaces in those dies in response to early transmission of chip identifier information relative to command execution.

20 Claims, 4 Drawing Sheets

(56) References Cited

U.S. PATENT DOCUMENTS

2012/0254472 A1   10/2012  Ware et al.
2018/0096979 A1    4/2018  Pappu et al.
2020/0319808 A1* 10/2020  Wang ..................... G06N 3/084

* cited by examiner

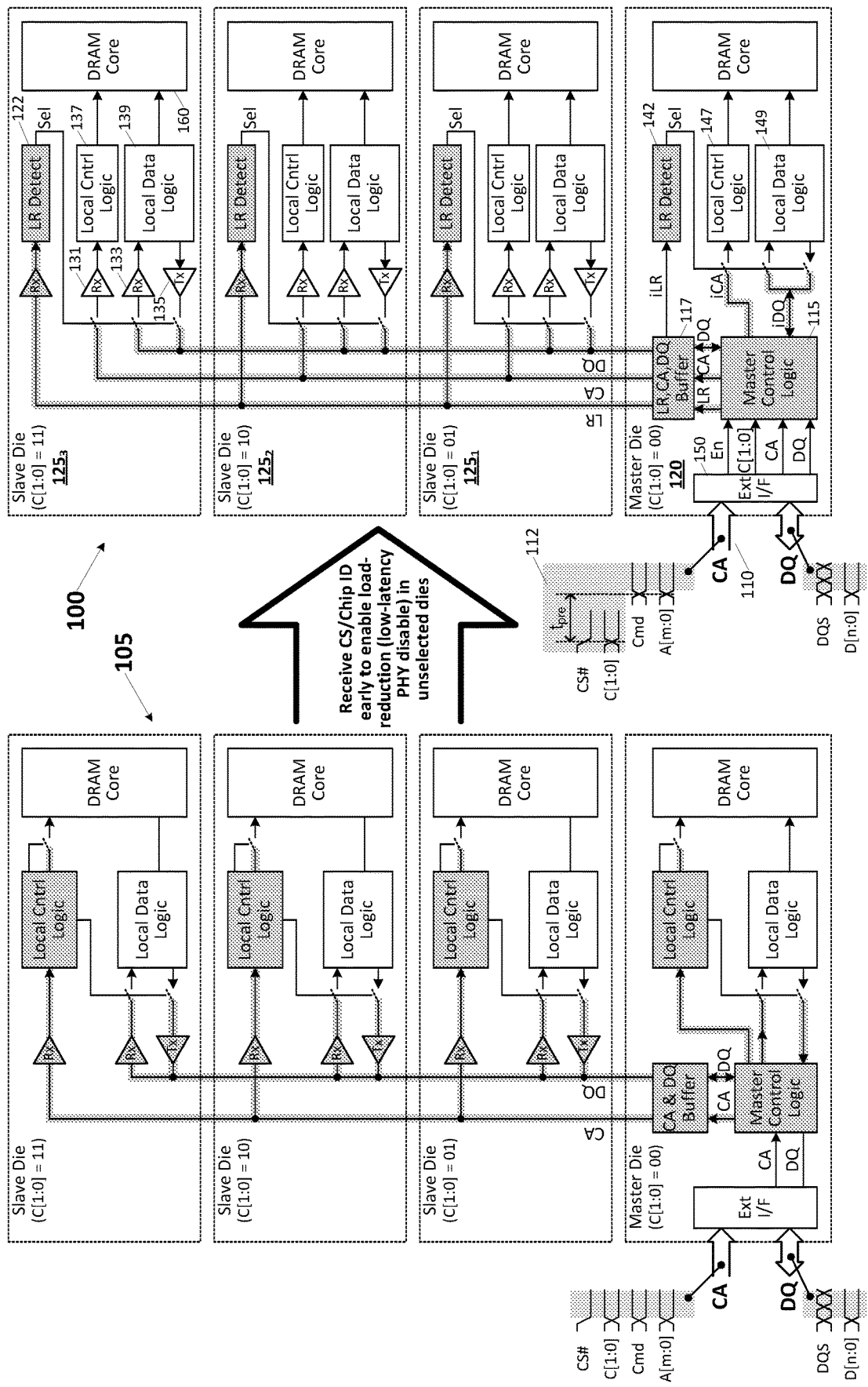
FIG. 1  Load-Reduced DRAM Stack

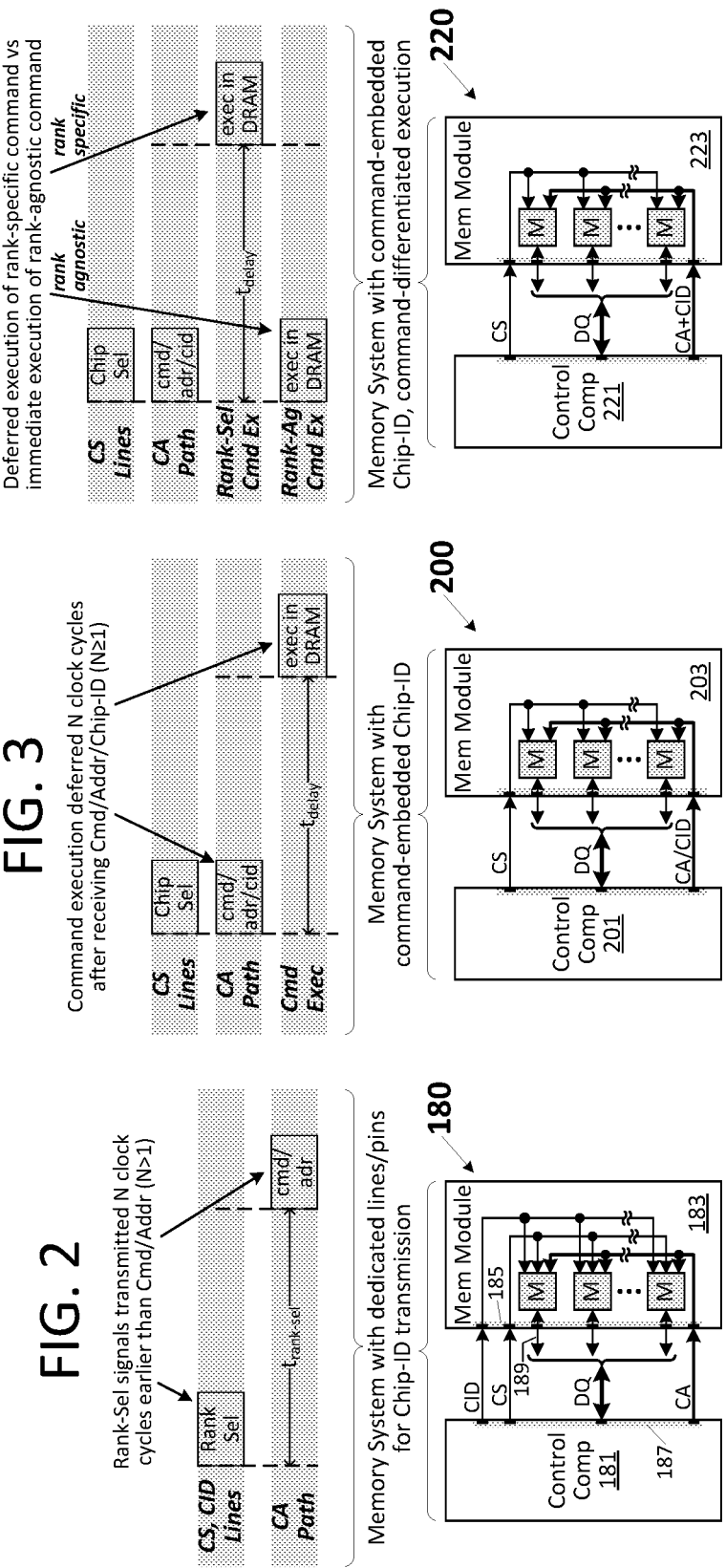

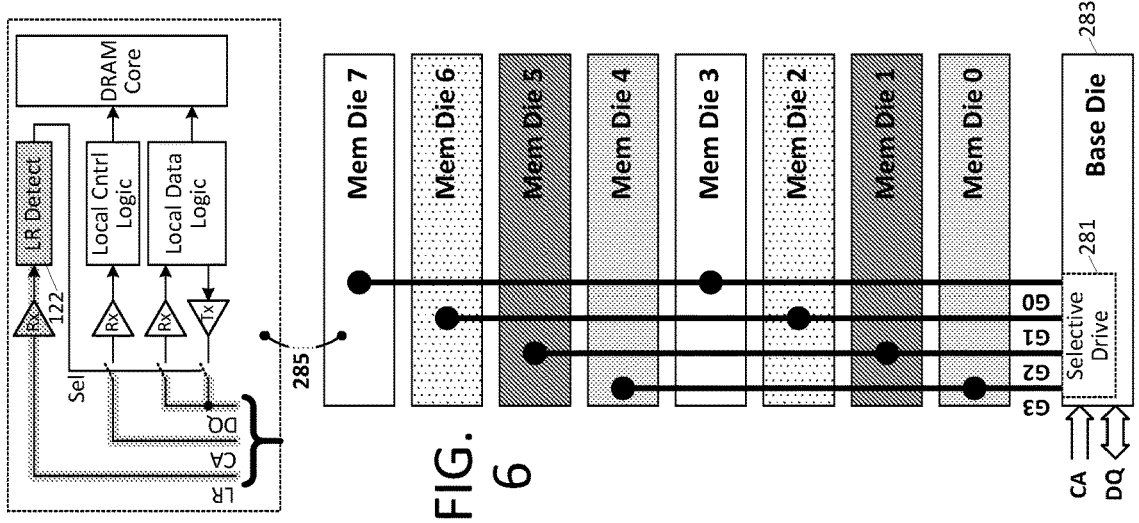
FIG. 6
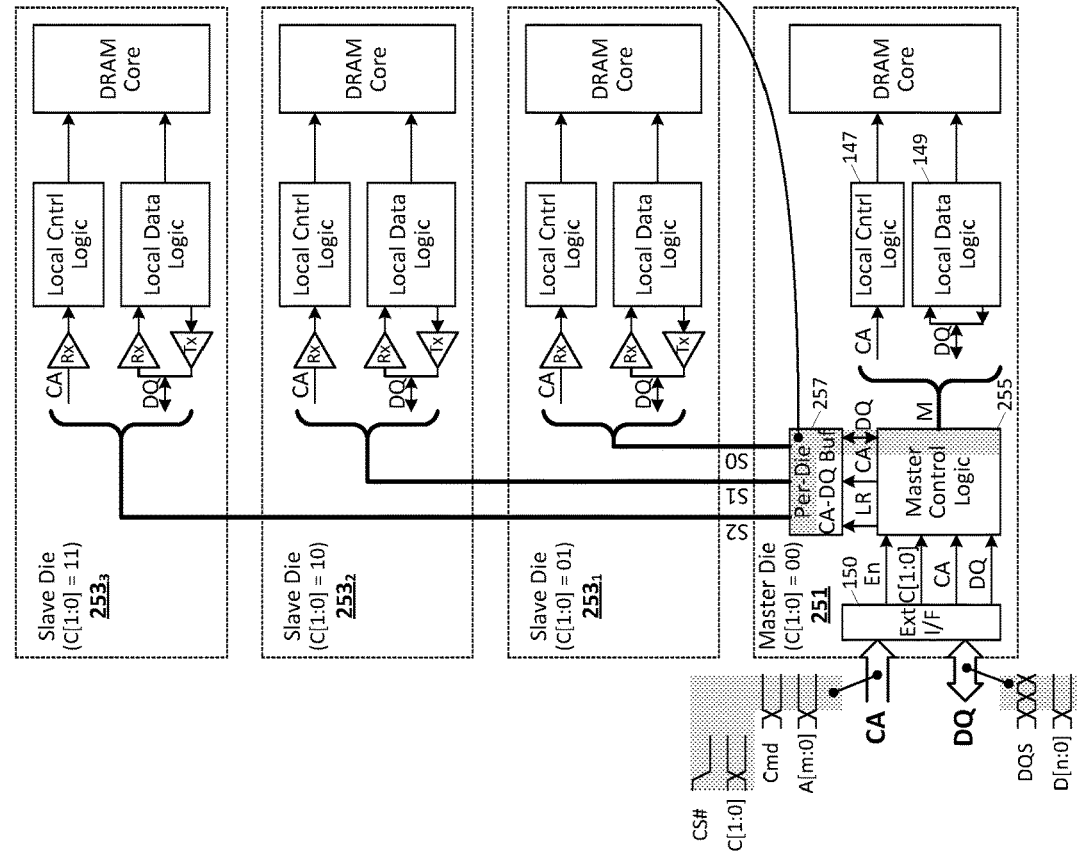
FIG. 5 Load-Reduced DRAM Stack with Per-Die CA-DQ

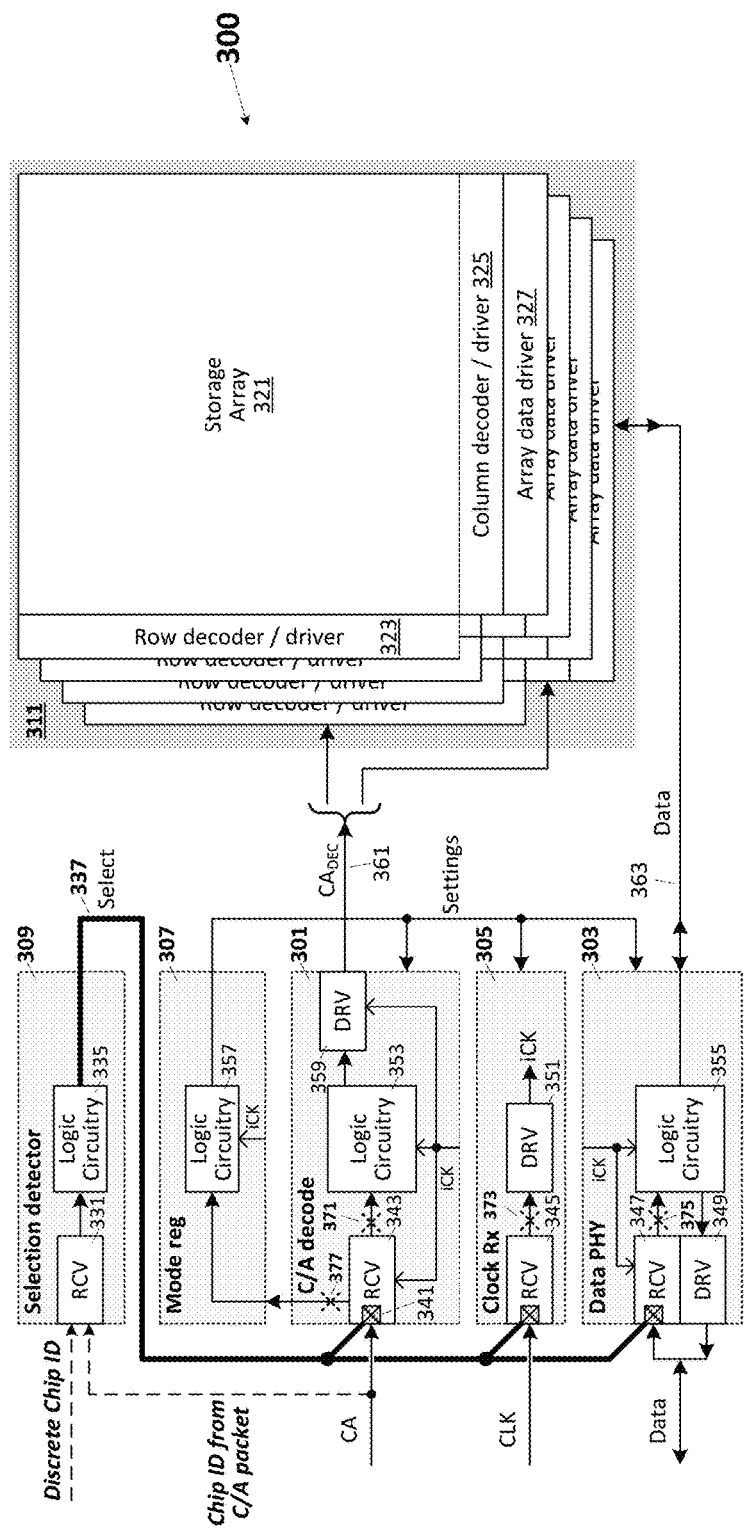
Fig. 7
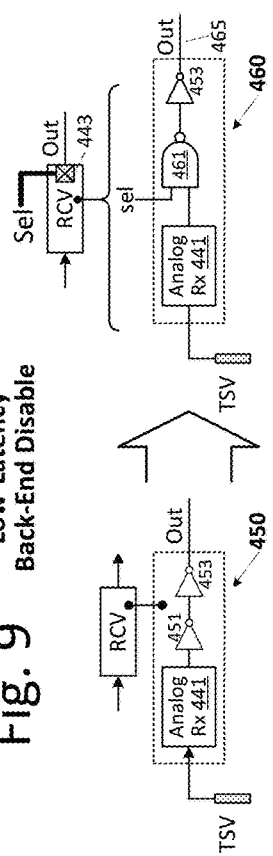
Fig. 9 Low-Latency Back-End Disable
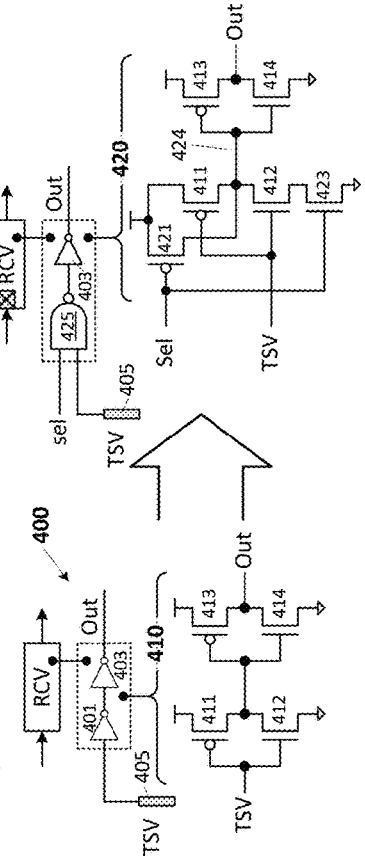
Fig. 8 Low-Latency Front-End Disable

# LOAD-REDUCED DRAM STACK

DRAWINGS

The various embodiments disclosed herein are illustrated by way of example, and not by way of limitation, in the figures of the accompanying drawings and in which like reference numerals refer to similar elements and in which:

FIG. 1 contrasts power consumption in a load-reduced four-die dynamic random access memory (DRAM) stack with power consumed in a conceptually similar DRAM stack that operates with legacy-mode command-execution timing;

FIG. 2 illustrates an exemplary transaction timing within a memory system populated by load-reduced 3-dimensionally stacked (3DS) DRAM components and having dedicated chip-identifier (chip-ID) signaling resources to enable transmission of chip-select and chip-ID signals in advance of corresponding command/address signals;

FIG. 3 shows an alternative memory system in which chip-ID information is conveyed from a control component to a memory module via the command/address path (CA) as part of a packetized command/address value instead via dedicated chip-ID signaling lines;

FIG. 4 illustrates a memory system similar to that of FIG. 3, but in which command execution is selectively deferred relative to command/address arrival at memory module;

FIG. 5 illustrates an alternative embodiment of a load-reduced 3DS DRAM component in which a master DRAM die is coupled to each of slave dies via a respective set of inter-die command/address and data lines;

FIG. 6 illustrates an embodiment of a load-reduced 3DS DRAM component having both logical-rank enable/disable circuitry within a master DRAM die (or base die) and logical rank detection circuitry within slave DRAM dies;

FIG. 7 illustrates an embodiment of a DRAM die that may be used to implement any of the load-reduced DRAM dies within the 3DS DRAM components presented in FIGS. 1 and 6;

FIG. 8 illustrates a low-latency front-end disable circuit that may be deployed within receiver circuits of constituent DRAM dies of the load-reduced 3DS DRAM components disclosed herein; and FIG. 9 illustrates a low-latency back-end disable circuit that may be deployed within receiver circuits (of constituent DRAM dies of the load-reduced 3DS DRAM components disclosed herein) having front-end analog receivers.

DETAILED DESCRIPTION

In various embodiments disclosed herein, power consumption in a three-dimensional stack (3DS) of dynamic random access memory (DRAM) integrated circuit dies is reduced through selective enabling/disabling of physical signaling interfaces (PHYs) in those dies in response to early transmission of chip identifier information relative to command execution. In a number of embodiments, a master die in the die stack receives the chip identifier information ("chip ID" or "CID") a predetermined number clock cycles before the corresponding command is to be executed and disables command/address and data PHYs in non-targeted (non-selected) slave DRAM dies—that is slave dies stacked on the master die and corresponding to a chip ID other than the chip ID associated with the instructed command. Through this operation, signaling resources are disabled in all but the targeted DRAM die, thus effecting a load-reduced 3DS DRAM component having substantially lower active power consumption than conventional DRAM die stacks. Signaling resources for accessing a local DRAM array in the master die (i.e., where the master die is one of the DRAM die in the stack) may also be selectively enabled/disabled in response to the pre-transmitted chip ID, further reducing power consumption.

FIG. 1 contrasts power consumption in a load-reduced four-die DRAM stack 100 with power consumed in a conceptually similar DRAM stack 105 that operates with legacy-mode command-execution timing. In the load-reduced implementation (or modal configuration), a chip-select signal and two-bit chip ID value (C[1:0]) are received a predetermined time, $t_{pre}$, prior to reception of a corresponding command/address (CA) value over CA links 110 as shown at 112, and applied within master control logic 115 and buffer/driver circuit 117 of a master DRAM die 120 to pre-drive the chip ID value to (i) respective logical-rank detection circuits 122 within the slave DRAM dies $125_1$-$125_3$ (via inter-die logical-rank select lines (LR) implemented, for example, by through-silicon vias, wire-bonds or any other practicable stacked IC die interconnects) and (ii) the master die via on-die logical-rank conductors iLR. The logical-rank detection circuits 122 within each of the slave dies $125_1$-$125_3$ (collectively, "slave dies 125") respond to the pre-driven chip ID value by selectively enabling or disabling the command/address and data receivers (and optionally transmitters to the extent those circuits perform termination or otherwise load inter-die CA and DQ signaling links) within all but the targeted slave die (if any), preventing power-consuming operation (e.g., input-signal-triggered logic state transitions) within downstream local control logic 137 and local data logic 139. Corresponding logical-rank detection circuitry 142 within master die 120 similarly enables or disables local command/address reception and data reception within the master die when a slave die (and not the master die) is the transaction target. These operations are shown conceptually by the select signal output ("Sel") from each of the slave-die LR detect circuits 122 to the input of the command/address receivers 131 and data receivers 133 (and optionally the data transmitters 135) of that slave die and the select signal output from master-die LR detect circuit 142 to input interfaces of local control logic 147 and local data logic 149 within the master die.

Contrasting the load-reduced operation at 100 with the legacy-mode operation at 105 (i.e., in one embodiment, the master control logic may be programmed to operate in either mode according to host controller capabilities and/or for consistent operation with other 3DS DRAM packages within the memory subsystem), forwarding the chip ID to the slave dies (and logical-rank detection circuitry 142 within the master die) ahead of the corresponding command/address and data values and disabling command/address and data reception within the non-targeted dies avoids the power consumption otherwise required—as in legacy mode—for all the dies to receive the incoming command/address value and inbound data. By this operation, the overhead of the stacked die configuration approaches an ideal in which the total power consumption in the die stack corresponds approximately to the per-die active-idle power (i.e., leakage current) multiplied by the number of dies in the die stack plus the power consumption above active-idle of the one die that is performing an operation. Because PHYs within all dies of the 3DS DRAM remain active in the legacy-mode operation at 105 (i.e., to enable parallel chip-ID, command/address and inbound data reception), signal-reception power is burned within non-targeted DRAM dies in every memory access transaction, imposing a power penalty for each stacked DRAM die well beyond the active-idle current-leakage power of that die and thus incurring a die-stack power consumption substantially above the ideal.

Still referring to the FIG. 1 embodiment of load-reduced 3DS DRAM component 100, a two-bit chip ID (C[1:0]) and active-low chip-select signal (CS#) arrive at external interface circuitry 150 of master die 120 a predetermined number of clock cycles (cycles of a system clock, not shown) prior to corresponding transaction signals which include, in this memory-write transaction example, both a command/address packet (depicted conceptually as including a command code 'Cmd' and address value 'A[m:0]') and inbound write data value ('D[n:0] which is timed by a data strobe signal, 'DQS' and may optionally include one or more data mask bits). External interface circuitry 150 responds to an asserted state of the chip-select signal by asserting an enable signal ('En') to master control logic 115, which in turn forwards the chip-ID value to buffer/driver 117. Buffer/driver 117 outputs the chip-ID (or value derived therefrom such as a set of decoded chip-ID signals) via a set of inter-die logical-rank (LR) lines to be received via a respective receiver and logical-rank detection circuit 122 within each slave die. As shown, buffer/driver 117 (or master control logic 115 itself) also outputs the chip-ID via internal logical rank lines (iLR) to local logical-rank detection circuit 142 within the master die. Each of the logical-rank detection circuits (122, 142) compares the incoming chip-ID value with a respective stored/programmed identifier value or hardwired identifier value unique to the host DRAM die (the "resident chip ID") to determine whether the host DRAM die (the master die 120 or one of the slave dies 125$_1$-125$_3$) is the target of the transaction specified by the associated command. The logical-rank detection circuits within all non-targeted dies (i.e., dies for which the respective LR detection circuit determines mismatch between received chip-ID and resident chip ID) deassert their respective selection signals ('Sel') to disable the on-die command/address and DQ signal reception. Conversely, the targeted die (LR detection circuit detects match between received and resident chip IDs) asserts selection signal ('Sel') to enable the corresponding command/address and data signal receivers (which may be within local control logic and local data logic on master die 120). By this operation, when the command/address and data signals (if any) for the transaction arrive (some number of clock cycles after the chip-ID and chip-select signals) and are forwarded via the inter-die signaling lines (CA and DQ driven by buffer/driver 117) and local signaling lines (iCA and iDQ driven by master control logic circuitry 115), transactional power consumed for reception and processing of the command/address signals and data signals is limited to the targeted DRAM die. For example, in a memory write transaction directed to slave DRAM die 125$_3$ (i.e., chip ID='11'), LR detect circuit 122 within that die asserts the select signal (Sel) to enable command/address reception within local control logic 137 (i.e., via receiver 131) and write data reception within local data logic 139 (via receiver 133) with local control logic 137 decoding the command/address value and outputting control signals and address signals to DRAM core 160 to effect storage of the write data as organized (e.g., parallelized for transmission) within the local data logic 139. By contrast, the deasserted select signal within each of the non-selected DRAM dies (i.e., slave dies 125$_1$ and 125$_2$, and master die 120) disables signal reception in the corresponding receiver circuits, substantially reducing per-transaction power consumption.

FIG. 2 illustrates an exemplary transaction timing within a memory system 180 populated by load-reduced 3DS DRAM components and having dedicated chip-ID signaling resources to enable transmission of chip-select and chip-ID signals in advance of corresponding command/address signals. The memory system includes a control component 181 (e.g., dedicated memory controller integrated circuit (IC), processor having a memory control function, etc.) coupled to a memory module 183 via command/address (CA), data (DQ) and chip-select (CS) and chip ID (CID) signaling links. In one embodiment, memory module 183 is a dual inline memory module (DIMM) having respective sets of load-reduced 3DS DRAM components (M) disposed on both faces of the module and coupled via on-module traces or conductors to a module interface 185. Memory system 180 may include additional memory module instances in alternative embodiments (or module-population configurations) and memory module 183 may have various form factors other than DIMM.

Continuing with the FIG. 2 example, the CA signaling links (group of signal lines for conveying command/address information as well as other control signals including, for example and without limitation, clock, clock-enable, on-die termination control, etc.) extend from contacts within a physical signaling interface 187 of control component 181 to counterpart contacts within module interface 185 (the latter contacts being, for example, disposed at an edge of the module substrate to form a DIMM socket-insertion interconnect) and from that point via on-module conductors to command/address contacts of each of the 3DS DRAM components. The chip ID and chip-select lines similarly extend between the control component PHY and module interface, continuing to input contacts (or pins) of each 3DS DRAM component as shown. The control component data interface is coupled to the memory module via a set of DQ links that include multiple link subsets—one link subset 189 for each 3DS DRAM component coupled to the same chip-select line (each such 3DS DRAM component referred to herein as being part of the same physical rank). By this arrangement, all 3DS DRAM components within a given physical rank selected by chip-select assertion, and more specifically a chip-ID-selected die within each of the multi-die 3DS DRAM components of the physical rank, may simultaneously receive write data from the control component via respective DQ link subsets 189 or simultaneously transmit read data to the control component via the respective DQ link subsets.

Still referring to FIG. 2, control component 181 transmits a rank-select value formed by a chip-select signal assertion (to select a physical rank) and a chip-ID value (to select a specific die within each 3DS DRAM component of the chip-select-targeted physical rank and thus a logical rank) to memory module 183 (or memory modules 183) via the chip-select and chip-ID lines a predetermined time ($t_{rank-sel}$) prior to transmission of a command/address value on the CA path. This pre-transmission (or early transmission or advance transmission) of the rank-select value provides time for the individual 3DS DRAM components of the selected physical rank to deliver the chip-ID to logical-rank detect circuits (i.e., as shown at 122 in FIG. 1) within constituent DRAM dies and thereby disable unneeded signal receivers and logic circuits in each of the non-targeted memory dies.

FIG. 3 shows an alternative memory system embodiment 200 implemented generally as described in reference to FIG. 2, but in which chip-ID information is conveyed from control component 201 to memory module 203 via the command/address path (CA) as part of a packetized command/address value (i.e., "CA/CID") instead dedicated chip-ID signaling lines (which are omitted). In this embodiment, control component 201 transmits the chip-select signal and command/address value (with embedded chip-ID information) to memory module 203 at the same time (or at least with less timing offset than the FIG. 2 t interval) to l enable command/address reception within a selected physical rank of 3DS DRAM components (M). Master control logic within each of the 3DS DRAM components (e.g., component 115 in FIG. 1) extracts the chip-ID information from the incoming command/address packet and forwards that information to the logical-rank detection circuits 122/142 within each constituent die of the DRAM stack prior to forwarding the command code and address components of the command/address packet to the slave dies or master-die local control logic (i.e., component 147 of FIG. 1), delaying the command-code/address forwarding for a time ($t_{delay}$—one or more cycles of a clock signal supplied from control component 201 to memory component 203 via a clock link (clock link not specifically depicted)) sufficient for the logical-rank detection circuits within constituent DRAM dies of the 3DS DRAM components to disable PHY components (e.g., signal receivers) and related logic circuitry within non-targeted DRAM dies. Thus, the extra time required for non-targeted die PHY disable is enforced by the 3DS DRAM components themselves, deferring execution of the operation commanded by the incoming command/address value by $t_{delay}$ relative to command/address arrival. During a memory write operation, memory control component 201 may transmit write data to the selected physical rank of 3DS DRAM components concurrently with (or a predetermined time after) transmission of the CA/CID packet without regard to the delayed command execution enforced within memory module 203. In that case, data may be buffered within the master die of each chip-select-enabled 3DS DRAM component for a period of time (e.g., corresponding but not necessarily equal to $t_{delay}$) prior to being forwarded to slave dies (or to the local data logic circuitry of the master die). In other embodiments, control component 201 may delay transmission of the write data by a period of time relative to the command/address packet transmission to obviate buffering of the write data within respective master dies of the selected physical rank of 3DS DRAM components.

FIG. 4 illustrates a memory system 220 similar to that of FIG. 3, but in which command execution is selectively deferred relative to command/address arrival at memory module 223—execution delayed by $t_{delay}$ or execution without delay—according to whether the command is directed to a specific logic DRAM rank (and thus a specific die within the 3DS DRAM component) or directed to all logical ranks. Through this command-differentiated execution, memory read and write commands directed by memory module 221 to a specific logical rank are deferred (not forwarded to constituent DRAM dies of the chip-select-enabled 3DS DRAM components) to provide time for selective PHY enable/disable while "rank-agnostic" commands (e.g., refresh, maintenance, calibration, multi-die mode-register programming, or other commands that are to be executed in parallel within all logical ranks and therefore all constituent DRAM dies of the chip-select-enabled physical rank of 3DS DRAM components) may be forwarded to constituent DRAM dies within chip-select-enabled 3DS DRAM components and executed without delay.

FIG. 5 illustrates an alternative embodiment of a load-reduced 3DS DRAM component 250 in which a master DRAM die 251 is coupled to each of slave dies $253_1$, $253_2$, $253_3$ via a respective set (S0, S1 or S2) of inter-die command/address and data lines—each inter-die signaling line being implemented, for example, by a through-silicon-via (TSV) or any other practicable die-to-die signal conductor. In the embodiment shown, master control logic 255 and/or driver buffer 257 within master die 251 respond to a pre-transmitted chip-ID value (i.e., C[1:0] received via external interface 150 one or more clock cycles early relative to corresponding command/address value and, in a write transaction, relative to incoming write data) by disabling output drive (over S0, S1, S2) to all but the targeted slave DRAM die, or disabling output to all slave DRAM dies if the master die is the transaction target. More specifically, master control logic 255 forwards a logical rank value (i.e., "LR" derived from or constituted by incoming chip-ID value, C[1:0]) to buffer component 257 which, in the case of a targeted slave die, forwards command/address and data (if any) signals only on the signaling paths (S0, S1 or S2) for the targeted slave die. Master control logic 255 may also disable outputs (M) to master-die local control logic 147 and local data logic 149. If the chip ID value indicates that the master DRAM die is the transaction target, the logical rank value supplied to buffer component 257 will trigger suppression of all buffer outputs (i.e., such that none of the S0, S1, S2 sets of CA-DQ lines is driven) while the master control logic drives the master-die CA-DQ lines (M) as necessary to implement the master-die transaction.

A conceptual view of load-reduction circuitry within master control logic 255 and buffer component 257 is shown in detail view 265. In the depicted example, the logical rank value supplied from master control logic 255 to buffer/driver 257 is decoded (if not provided in decoded form) to yield respective slave-die enable signals (LR0, LR1, LR2) according to the targeted logical rank. Accordingly, if a slave DRAM die (rather than the master DRAM die) is a transaction target, buffer/driver 257 will respond to the incoming logical rank value by enabling incoming command/address and DQ signals (if any) to be forwarded to the specifically targeted slave DRAM die while disabling command/address and DQ output to the other slave dies. Similarly, in the case of a transaction targeting a slave die, the master control logic may deassert an enable-master signal (eM) to suppress output drive to local control and data logic circuitry (147, 149) via the master CA-DQ line set (M). In the case of a transaction targeting the master DRAM die, the master control logic will assert the enable-master signal and supply a logical rank value to buffer/driver 257 that triggers deassertion of the decoded slave-die enable signals (or supply those decoded enable signals directly) such that none of the slave-die CA-DQ signaling lines (i.e., none of S0, S1, S2) is driven.

Though FIG. 5 illustrates pre-transmitted (early reception) of the chip-ID and chip-select signals, the deferred command execution arrangements in FIGS. 3 and 4 may also be employed in the depicted architecture. That is, master control logic 255 (and/or external interface circuitry 150) may impose a delay between command/address reception within the 3DS DRAM component and execution of that command as necessary to provide time for application of the chip-ID value within logical-rank enable circuitry (i.e., as shown in detail view 265) to disable output drive to non-targeted DRAM dies.

FIG. 6 illustrates another embodiment of a load-reduced 3DS DRAM component, in this case having both logical-rank enable/disable circuitry within a master DRAM die (or base die) and logical rank detection circuitry within the slave DRAM dies. More specifically, individual sets of slave-die signaling lines (G0, G1, G2, G3)—each including a respective set of command/address signaling lines, data signaling lines and one or more logical-rank lines—are coupled in common to two or more slave DRAM dies within a logical die "group." Selective driver circuitry 281 within a base die 283 (which may be a master DRAM die or a dedicated interface die, the latter having, for example, having a register clock driver function but lacking the DRAM array implemented within the slave DRAM dies) disables output drive on the CA-DQ lines coupled to all non-targeted DRAM groups (while driving the logical rank lines for the non-targeted group to ensure non-detection/non-selection of each of the DRAM dies within the group) while enabling output drive on the CA-DQ lines for the targeted DRAM die group and driving the LR lines for that group to make ready for signaling within the targeted DRAM die within that group. By this arrangement, logical-rank detection circuitry 122 within all non-targeted DRAM dies (i.e., as shown in detail view 285) will deassert selection signal (Sel) and thus disable CA-DQ signal reception, while the logical-rank detection circuitry within the targeted DRAM die does the opposite—asserting the selection signal to enable command/address and data signal reception. Thus, the architecture in FIG. 6 implements a hybrid approach between the per-slave-die DQ-CA path arrangement of FIG. 5, and the fully-shared CA-DQ path of FIG. 1. As in the FIG. 1 and FIG. 5 embodiments, each of the transactional timing arrangements presented in FIGS. 2-4 may be implemented within the FIG. 6 architecture—that is, pre-transmission/pre-reception of the chip-ID value relative to corresponding command/address or concurrent chip-ID and command/address transmission/reception (including embedding chip-ID in packetized command/address value) with deferred command execution enforced within the 3DS DRAM component.

FIG. 7 illustrates an embodiment of a DRAM die 300 that may be used to implement any of the load-reduced DRAM dies within the 3DS DRAM components discussed above in reference to FIGS. 1-6. In the depicted example, DRAM die 300 includes command/address decode circuitry 301, data PHY 303, clock receiver 305, mode register circuitry 307, selection detector 309 and core storage 311, the latter implemented by a set of DRAM banks each having a storage array 321 and array access circuitry including a row-address decoder/driver 323, a column-address decoder/driver 325 and an array data driver 327. During a memory access transaction within the host 3DS DRAM component (i.e., chip-select signal asserted at chip-select input of master die or base die of 3DS DRAM component incorporating DRAM die 300), a chip-ID value is received via receiver 331 of selection detector 309 (i.e., arriving either via discrete chip-ID lines as shown in FIG. 1 or via command/address lines, CA—alternatives indicated by the dashed-line inputs to receiver 331) and applied within logic circuitry 335 (i.e., having logic circuit components and signal latching elements) to generate a select signal 337 in either an asserted or deasserted state according to whether the chip-ID value matches or does not match a pre-stored or hardwired chip-ID value for DRAM die 300. In the depicted embodiment, the select signal is supplied to low-latency front-end enable/disable circuits 341 within respective receivers 341, 345, 347 of command/address decoder 301, data PHY 303 and clock receiver 305. Write data drivers 349 may also be disabled. Accordingly, when the incoming chip ID value indicates that DRAM die 300 is a target of a memory-access transaction (match between resident and incoming chip ID values), logic circuitry 335 asserts selection signal 337 to enable command/address, clock and data reception within circuit blocks 301, 305 and 303, respectively. In that case, clock receiver 305 receives the incoming clock (via receive circuitry 345) and forwards the clock via driver 351 (i.e., an internal instance thereof shown as 'iCK') to receiver circuits (341, 345, 347) and logic circuitry (353, 355) within command/address decoder 301 and data PHY 303, to logic circuitry 357 within mode register block 307 and to driver circuitry 359 within the command/address decoder (similar driver circuitry may also be provided in data PHY 303 and clocked by iCK to drive write data to the core storage 311). Receiver 343 within command/address circuitry forwards the incoming command/address value to logic circuitry 353 (e.g., decode and control circuitry) which in turn decodes the command value to produce control signals 361 which are then driven to core storage 311 as a set of decoded command/address signals ($CA_{DE}c$, including row address and row control signals during a row activation operation, and column control signals during column read and write transactions). Write data associated with a memory write transaction is received within data PHY 303 (i.e., via receiver circuit 347 concurrently with or shortly after reception of the corresponding command/address value within C/A decoder 301) and forwarded to logic circuitry 355 for buffering and/or deserialization prior to being forwarded to core storage 311 via internal data path 363. In the case of a mode-register programming operation, mode register parameters (i.e., information or settings to be stored within the mode register) are received within C/A decoder 301 as part of the incoming command/address packet (i.e., received instead of row and/or column address values) and forwarded to logic circuitry 357 for storage within one or more registers therein. The programmed settings are then output to one or more of the other circuit blocks (including C/A decoder 301, clock receiver 305 and data PHY 303 as shown and also, in some embodiments, to the selection detector 309—for example, to supply a mode-register-stored chip ID value thereto) to control and/or configure operational aspects thereof.

Still referring to FIG. 7, in some embodiments, receivers 343, 345 and 347 include analog front-end components that may not be easily disabled (e.g., powered down or otherwise rendered to an inactive state) without incurring non-negligible time delay for restoring to active service (i.e., latency penalty for disable/re-enable cycle). In those cases, instead of disabling receivers 343, 345, 347 at the front end (i.e., at signal reception buffer elements coupled to the incoming die-to-die signaling lines), circuit components following the front end (i.e., receiving the outputs of the analog front-end circuits) may be provided as indicated conceptually at 371, 373, 375 and 377 to provide low-latency back-end disable operations. While this arrangement leaves the receiver front-ends in an enabled state despite deassertion of select signal 337, substantial load reduction is still achieved (i.e., no activation of downstream circuits 351, 353, 355, 357) without incurring unacceptably high disable-latency.

FIG. 8 illustrates a low-latency front-end disable circuit that may be deployed within buffer receivers otherwise implemented, for example, by back-to-back inverters 401, 403 coupled to the inter-die signaling conductor 405 (i.e., a TSV in this example) as shown at 400. More specifically, the lead inverter 401 (otherwise implemented by transistors 411 and 412 as shown in detail view 410) is supplemented by additional transistors 421 and 423 that ensure that the input to drive inverter 403 (implemented by transistors 413 and 414) remains high regardless of the TSV signal state if the select signal (Sel) is low/deasserted—generally implementing the NAND function shown symbolically at 425 so that, if the selection signal (Sel) is low, the output of NAND gate 425 remains high and the output of drive inverter 403 (Out)

remains low and thus inactive. In the transistor detail at 420, if Sel is low, then PMOS (P-type Metal Oxide Semiconductor) transistor 421 will be switched on (conducting) to pull the potential of node 424 (the output of NAND gate 425 and input of drive inverter 403) high, while NMOS (N-type MOS) transistor will be switched off (non-conducting) to isolate the NAND output (node 424) from ground. Conversely, if Sel is high (indicating that the DRAM die is the target of a transaction conveyed in incoming signals), transistor 421 will be off and transistor 423 will be on so that the state of the signal conveyed via TSV 405 will determine whether node 424 is pulled up (TSV is low, switching on transistor 411) or down (TSV is high, switching on transistor 412 and thus pulling node 424 to ground via the series connection of transistors 412 and 423). Thus, if the TSV signal is high, node 424 will be low to produce a high output from drive inverter 403 and if the TSV signal is low, node 424 will be high to produce a low output from driver inverter 403.

FIG. 9 illustrates an embodiment of a receiver having an analog front-end 441 and back-end disable logic 443. The disable logic 443 is implemented generally as shown in FIG. 8 by replacing the lead inverter in a series-coupled inverter pair (i.e., a non-inverting buffer implemented by lead inverter 451 and drive inverter 453 as shown at 450) with a NAND gate 461 as shown at 460—an arrangement that enables a select signal (Sel) to gate the NAND gate/inverter output 465, forcing the output low (i.e., to an inactive state which may alternatively be high) when the select signal is deasserted, and enabling the output to follow the TSV signal state when the select signal is asserted. Thus, instead of disabling analog signal receiver 441 (the front-end of the receiver block) and incurring the typically substantial re-enable latency (timing delay), the back-end output drive of the circuit may be rapidly enabled and disabled, reducing power consumption within non-targeted DRAM dies without imposing re-enable latency penalty when one of those dies is later targeted (i.e., in a subsequent transaction). Note that the two non-inverting disable/enable circuits shown in FIGS. 8 and 9 may instead perform a signal inversion (e.g., by omitting drive inverter 403/453) either to restore an active-low inbound signal to active-high (or vice-versa) or in view of downstream inversion carried out in within logic circuitry of the host circuit block.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, instead of DRAM integrated circuit dies having arrays of DRAM storage cells, constituent memory dies within 3DS memory components may be implemented with various other storage cell technologies (e.g., Flash memory storage cells, static random access memory storage cells, etc.). Similarly, the bit-depth of various signals (chip-ID), number of dies within a given 3DS memory component, number of memory banks per memory die, etc., may be different from those presented in embodiments herein. Additionally, links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. Circuit functions implemented with PMOS transistors may be implemented instead with NMOS transistors (and vice-versa), with appropriate changes in transistor source connections (e.g., to opposite polarity voltage rails). A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A stacked-die memory component comprising:
an inter-die signaling path;
a base die coupled to the inter-die signaling path and having:
a first signaling interface to receive a chip-select signal, chip-identifier value and command/address value from a source external to the stacked-die memory component;
circuitry to drive the chip-identifier value onto one or more chip-identifier lines of the inter-die signaling path during a first interval and to drive the command/address value onto one or more command/address lines of the inter-die signaling path during a second interval that commences a predetermined time after the first interval;
a memory die stacked on the base die and coupled to the inter-die signaling path, the memory die having:
circuitry to receive the chip-identifier value via the one or more chip-identifier lines and to either assert or deassert a control signal according to whether the chip-identifier value matches or does not match, respectively, a resident identifier value of the memory die;
circuitry to receive the command/address value via the one or more command/address lines if the control signal is asserted and to disable reception of the command/address value if the control signal is deasserted.

2. The stacked-die memory component of claim 1 further comprising one or more additional memory dies coupled to the inter-die signaling path and disposed in a stack that includes the base die, each of the one or more additional memory dies having:
circuitry to receive the chip-identifier value via the one or more chip-identifier lines and to either assert or deassert an additional-memory-die control signal according to whether the chip-identifier value matches or does not match, respectively, a resident identifier value of the additional memory die;
circuitry to receive the command/address value via the one or more command/address lines if the additional-memory-die control signal is asserted and to disable reception of the command/address value if the additional-memory-die control signal is deasserted.

3. The stacked-die memory component of claim 1 wherein the memory die comprises a programmable register to store the resident identifier value.

4. The stacked-die memory component of claim 1 wherein the memory die comprises one of a plurality of memory dies stacked on the base die and wherein each of the plurality of memory dies has a unique fixed resident identifier value fixed according to location within the stack.

5. The stacked-die memory component of claim 1 wherein the base die comprises a memory die having:
circuitry to receive the chip-identifier value from the first signaling interface and to either assert or deassert a base-die control signal according to whether the chip-identifier value matches or does not match, respectively, a resident identifier value of the base die; and
control logic circuitry to receive the command/address value from the first signaling interface if the base-die control signal is asserted and to disable reception of the command/address value if the base-die control signal is deasserted.

6. The stacked-die memory component of claim 1 wherein the circuitry to drive the chip-identifier value onto the one or more chip-identifier lines of the inter-die signaling path comprises circuitry to drive the chip-identifier onto the one or more chip-identifier lines only if the chip-select signal is in an asserted state.

7. The stacked-die memory component of claim 1 wherein the first signaling interface to receive the chip-select signal, chip-identifier value and command/address value comprises a chip-select input to receive the chip-select signal, one or more chip-identifier inputs to receive the chip-identifier value, and one or more command/address inputs to receive the command/address value.

8. The stacked-die memory component of claim 1 wherein the first signaling interface to receive the chip-select signal, chip-identifier value and command/address value comprises a chip-select input to receive the chip-select signal and one or more command/address inputs to receive, prior to the first interval, a control value that includes, in packetized form, the command/address value and the chip-identifier value.

9. A method of operation within a stacked-die memory component having an inter-die signaling path, a base die coupled to the inter-die signaling path and a memory die coupled to the inter-die signaling path, the method comprising:
receiving, via a signaling interface of the base die, a chip-select signal, chip-identifier value and command/address value from a source external to the stacked-die memory component;
driving the chip-identifier value onto one or more chip-identifier lines of the inter-die signaling path during a first interval;
driving the command/address value onto one or more command/address lines of the inter-die signaling path during a second interval that commences a predetermined time after the first interval;
receiving the chip-identifier value within the memory die via the one or more chip-identifier lines;
asserting or deasserting a first control signal within the memory die according to whether the chip-identifier value matches or does not match, respectively, a resident identifier value of the memory die; and
receiving the command/address value within the memory die via the one or more command/address lines if the first control signal is asserted and disabling reception of the command/address value within the memory die if the first control signal is deasserted.

10. The method of claim 9 further comprising storing the resident identifier value within a programmable register of the memory die in response to a register programming instruction received within the memory die via the command/address lines of the inter-die signaling path.

11. The method of claim 9 wherein the memory die comprises one of a plurality of memory dies stacked on the base die and wherein each of the plurality of memory dies has a unique fixed resident identifier value fixed according to location within the stack.

12. The method of claim 9 wherein the base die comprises a memory die, the method further comprising:
asserting or deasserting a second control signal within the base die according to whether the chip-identifier value matches or does not match, respectively, a resident identifier value of the base die; and receiving the command/address value within control logic circuitry of the base die if the second control signal is asserted and to disabling reception of the command/address value within the control logic circuitry if the second control signal is deasserted.

13. The method of claim 9 wherein driving the chip-identifier value onto the one or more chip-identifier lines of the inter-die signaling path comprises driving the chip-identifier onto the one or more chip-identifier lines only if the chip-select signal is in an asserted state.

14. The method of claim 9 wherein the receiving the chip-select signal, chip-identifier value and command/address value via the signaling interface of the base die comprises:
  receiving the chip-select signal via a chip-select input of the signaling interface;
  receiving the chip-identifier value via one or more chip-identifier inputs of the signaling interface; and
  receiving the command/address value via one or more command/address inputs.

15. The method of claim 9 wherein receiving the chip-select signal, chip-identifier value and command/address value via the signaling interface of the base die comprises:
  receiving the chip-select a chip-select input of the signaling interface;
  and receiving, via one or more command/address inputs of the signaling interface prior to the first interval, a control value that includes, in packetized form, the command/address value and the chip-identifier value.

16. A stacked-die memory component comprising:
  memory dies disposed in a stack;
  die-to-die signaling paths each coupled exclusively to a corresponding one of the memory dies;
  a base die coupled to the die-to-die signaling paths and having:
    a first signaling interface to receive a chip-select signal, chip-identifier value and command/address value from a source external to the stacked-die memory component, the chip-identifier value indicating a selected one of the die-to-die signaling paths; and
    circuitry to drive the command/address value exclusively onto the selected one of the die-to-die signaling paths, to be received by a corresponding one of the memory dies, while maintaining each other of the die-to-die signaling paths in an idle state.

17. The stacked-die memory component of claim 16 wherein each of the die-to-die signaling paths comprises a plurality of command/address conductors and a plurality of data conductors.

18. The stacked-die memory component of claim 16 wherein each of the die-to-die signaling paths comprises a plurality of through-silicon-vias (TSVs), and wherein the TSVs of one of the die-to-die signaling paths extend from the base die through a first one of the memory dies to reach a second one of the memory dies.

19. The stacked-die memory component of claim 16 wherein the first signaling interface to receive the chip-select signal, chip-identifier value and command/address value comprises a chip-select input to receive the chip-select signal, one or more chip-identifier inputs to receive the chip-identifier value, and one or more command/address inputs to receive the command/address value.

20. The stacked-die memory component of claim 1 wherein the first signaling interface to receive the chip-select signal, chip-identifier value and command/address value comprises a chip-select input to receive the chip-select signal and one or more command/address inputs to receive a control value that includes, in packetized form, the command/address value and the chip-identifier value.

* * * * *